(12) United States Patent
Patrick et al.

(10) Patent No.: US 7,153,719 B2
(45) Date of Patent: Dec. 26, 2006

(54) METHOD OF FABRICATING A STORAGE GATE PIXEL DESIGN

(75) Inventors: Inna Patrick, Boise, ID (US); Sungkwon C. Hong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 10/923,692

(22) Filed: Aug. 24, 2004

(65) Prior Publication Data

US 2006/0046338 A1 Mar. 2, 2006

(51) Int. Cl.
*H01L 21/00* (2006.01)

(52) U.S. Cl. .................... 438/60; 257/E21.617; 438/57

(58) Field of Classification Search .................... 438/60
See application file for complete search history.

(56) References Cited

U.S. PATENT DOCUMENTS

| | | | |
|---|---|---|---|
| 4,656,519 A | 4/1987 | Savoye | |
| 4,684,812 A | 8/1987 | Tew et al. | |
| 4,686,373 A | 8/1987 | Tew et al. | |
| 4,758,895 A | 7/1988 | Elabd | |
| 4,779,004 A | 10/1988 | Tew et al. | |
| 6,534,335 B1 | 3/2003 | Rhodes et al. | |
| 6,784,933 B1* | 8/2004 | Nakai | 348/302 |
| 7,015,522 B1* | 3/2006 | Miyagawa et al. | 257/292 |
| 2001/0011736 A1 | 8/2001 | Dierickx | |
| 2001/0017382 A1 | 8/2001 | Rhodes et al. | |
| 2002/0024071 A1* | 2/2002 | Kawajiri et al. | 257/292 |
| 2002/0175355 A1* | 11/2002 | Shim | 257/290 |
| 2003/0020099 A1 | 1/2003 | Taylor | |
| 2003/0096438 A1 | 5/2003 | Lee | |
| 2005/0064617 A1* | 3/2005 | Dierickx | 438/48 |
| 2005/0280054 A1* | 12/2005 | Park et al. | 257/290 |

FOREIGN PATENT DOCUMENTS

EP 11284166 10/1999

* cited by examiner

*Primary Examiner*—Asok Kumar Sarkar
(74) *Attorney, Agent, or Firm*—Dickstein Shapiro LLP

(57) ABSTRACT

A method of fabricating a pixel cell having a shutter gate structure. First and second charge barriers are respectively created between a photodiode and a first charge storage region and between the first storage region and a floating diffusion region. A global shutter gate is formed to control the charge barrier and transfer charges from the photodiode to the first charge storage region by effectively lowering the first charge barrier. A transfer transistor acts to transfer charges from the first storage region to the floating diffusion region by reducing the second charge barrier.

34 Claims, 18 Drawing Sheets

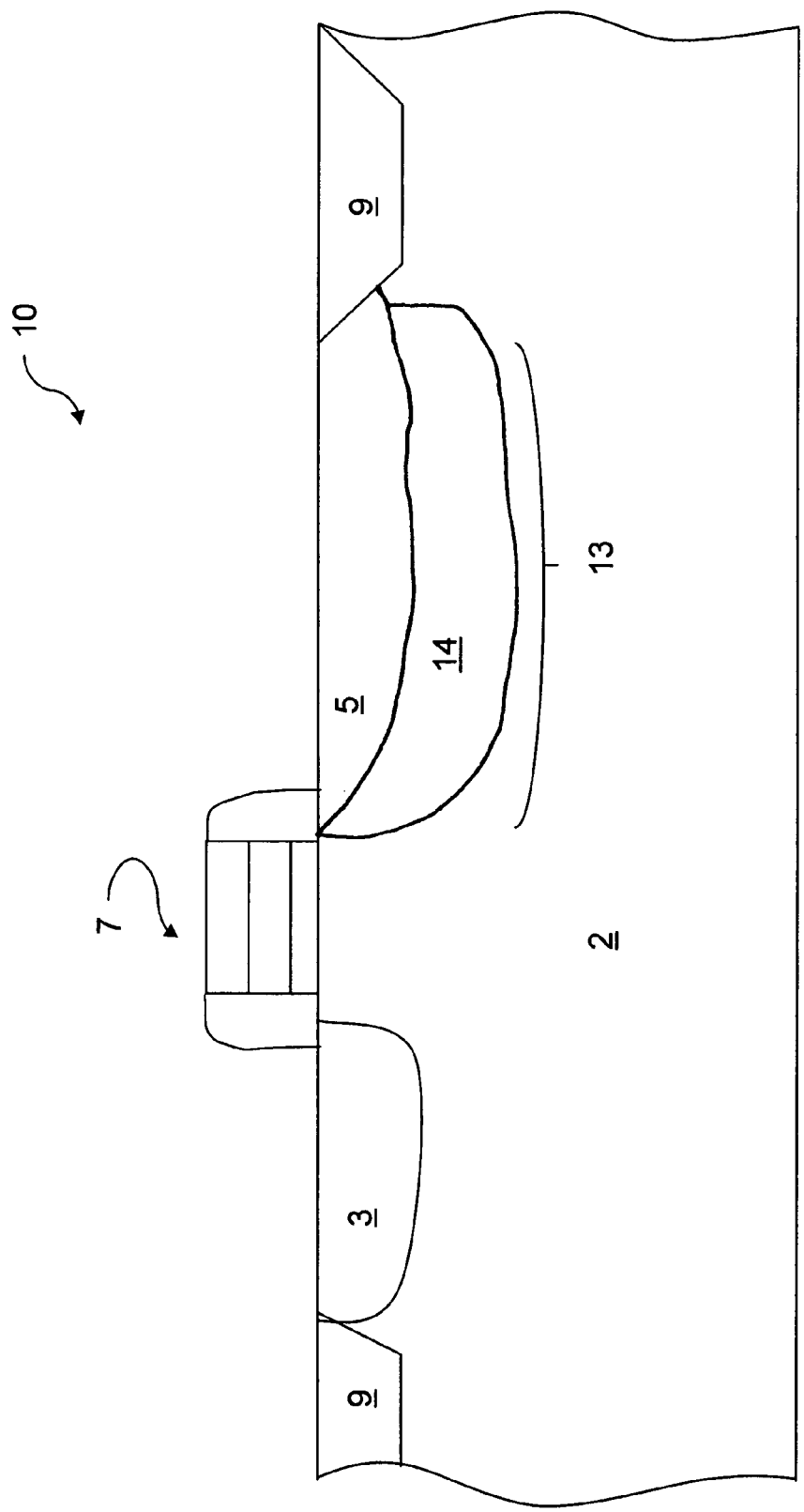

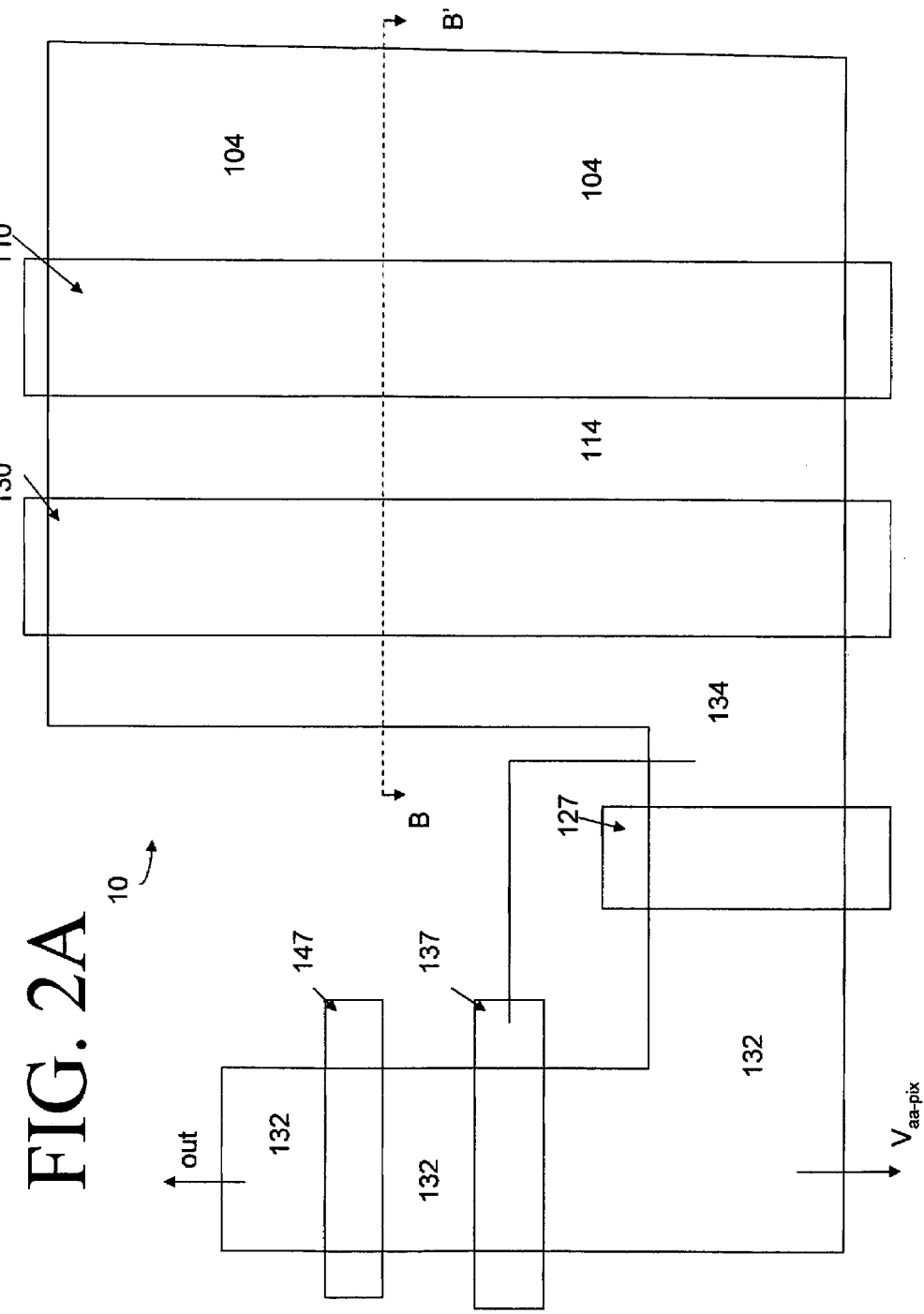

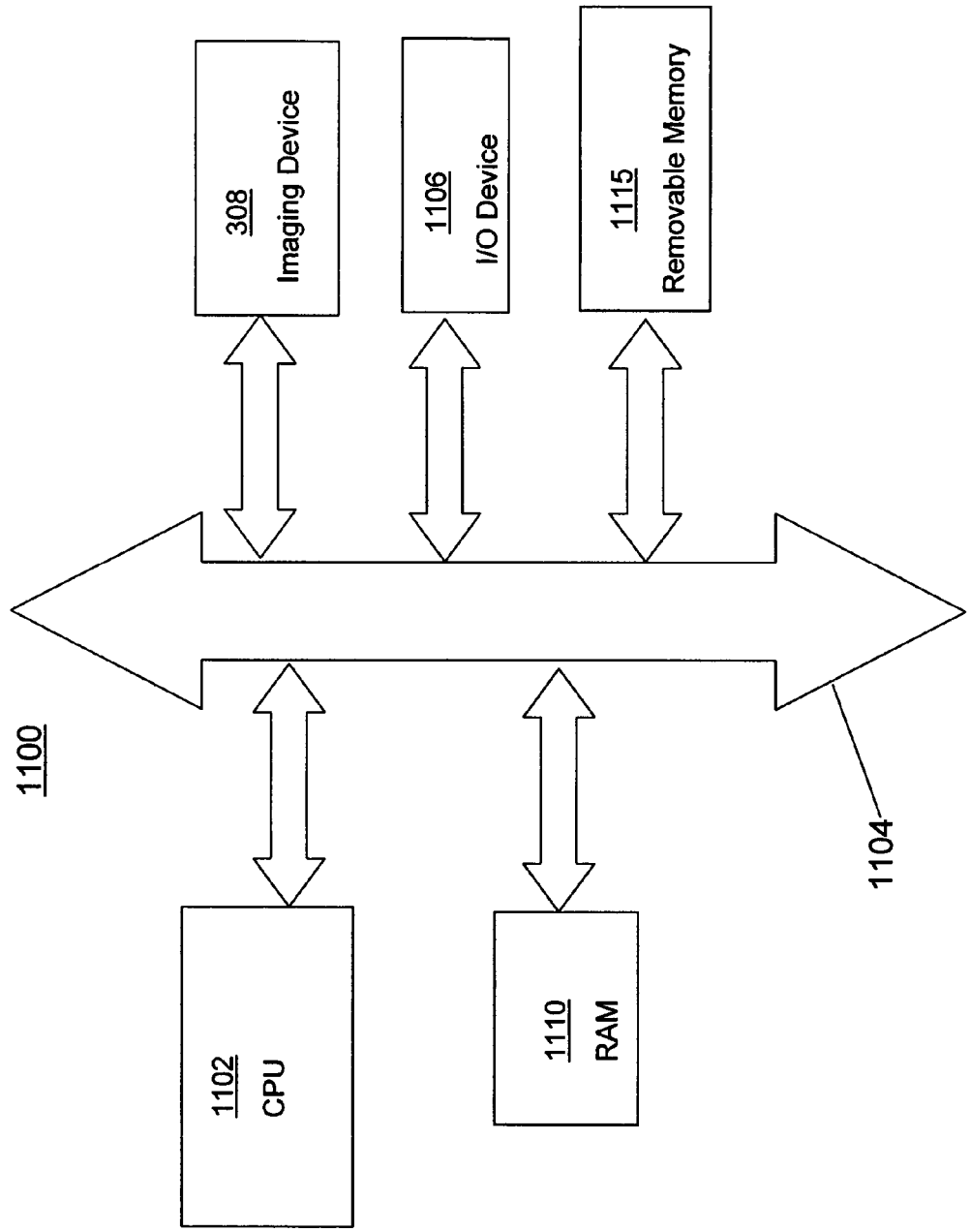

METHOD OF FABRICATING A STORAGE GATE PIXEL DESIGN

FIELD OF THE INVENTION

The present invention relates to the field of semiconductor devices and, in particular, to a method of fabricating a pixel that includes a storage gate.

BACKGROUND OF THE INVENTION

A CMOS imager includes a focal plane array of pixel cells, each cell includes a photosensor, for example, a photogate, photoconductor or a photodiode overlying a substrate for producing a photo-generated charge in a doped region of the substrate. In a CMOS imager, the active elements of a pixel cell, for example a four transistor (4T) pixel, perform the necessary functions of (1) photon to charge conversion; (2) transfer of charge to the floating diffusion region; (3) resetting the floating diffusion region to a known state before the transfer of charge to it; (4) selection of a pixel cell for readout; and (5) output and amplification of a signal representing a reset voltage and a pixel signal voltage based on the photo converted charges. The charge at the floating diffusion region is converted to a pixel or reset output voltage by a source follower output transistor.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, all assigned to Micron Technology, Inc. The disclosures of each of the forgoing patents are hereby incorporated by reference herein in their entirety.

A schematic diagram of a conventional CMOS four-transistor (4T) pixel cell 10 is illustrated in FIGS. 1A and 1B. FIG. 1A is a top-down view of the cell 10; FIG. 1B is a cross-sectional view of the cell 10 of FIG. 1A, taken along line A–A'. The illustrated cell 10 includes a pinned photodiode 13 as a photosensor. Alternatively, the CMOS cell 10 may include a photogate, photoconductor or other photon-to-charge converting device, in lieu of the pinned photodiode 13, as the initial accumulating area for photo-generated charge. The photodiode 13 includes a p+ surface accumulation layer 5 and an underlying n− accumulation region 14 formed in a p-type semiconductor substrate layer 2.

The pixel cell 10 of FIG. 1 has a transfer gate 7 for transferring photocharges generated in the n− accumulation region 14 to a floating diffusion region 3 (i.e., storage region). The floating diffusion region 3 is further connected to a gate 27 of a source follower transistor. The source follower transistor provides an output signal to a row select access transistor having a gate 37 for selectively gating the output signal to a terminal (not shown). A reset transistor having a gate 17 resets the floating diffusion region 3 to a specified charge level before each charge transfer from the n− region 14 of the photodiode 13.

The illustrated pinned photodiode 13 is formed on a p-type substrate 2. It is also possible, for example, to have a p-type substrate base in an n-type epitaxial layer. The n− accumulation region 14 and p+ accumulation region 5 of the photodiode 13 are spaced between an isolation region 9 and a charge transfer gate 7. The illustrated, conventional pinned photodiode 13 has a p+/n−/p− structure.

Imager pixels, including CMOS imager pixels 10 typically have low signal to noise ratios and narrow dynamic range because of their inability to fully collect, transfer and store the electric charge collected by the photosensitive area of the photosensor. In addition, the pixels are subject to kTC noise, which is a thermal dependent noise generated during the reset of the pixel. The kTC noise refers to the random variation of voltage during the reset of a diffusion area or a storage capacitor.

Because the size of the pixel electrical signal is very small, the signal to noise ratio and dynamic range of the pixel should be as high as possible. In addition, customer demands increasingly call for applications requiring higher dynamic range. The use of additional gates to increase the functional operations of the pixel (e.g., electronic shuttering), however, increases the size of the pixel or reduces the fill factor of the pixel.

One invention that has been suggested for dealing with noise in scaled pixels while providing an electronic shutter is a shutter gate. When a shutter gate is implemented in a pixel design, a storage node is also added such that charges accumulated in a photodiode 13 are transferred through the shutter gate to a storage node. The additional storage node allows the floating diffusion node to be reset and readout prior to charge transfer to the floating diffusion node, thus allowing for correlated double sampling and a reduction of kTC noise. The amount of charge the pixel can store also increases since the gated storage node has a greater charge storage capacity than the photodiode node. An example of a pixel incorporating a shutter gate is U.S. application Ser. No. 10/721,191, assigned to Micron Technology Inc., and incorporated herein by reference.

Additionally, in conventional pixel cells, potential barriers may exist in the path of the photo-generated charge as it is transferred from the photo-conversion device to readout circuitry. Such potential barriers may prevent a portion of the photo-generated charge from reaching the readout circuitry, thereby reducing the charge transfer efficiency of the pixel cell and also reducing the quality of a resultant image. Accordingly, what is needed is a relatively simple method for fabricating a pixel cell with an electrical shutter having good charge transfer characteristics with low charge loss.

BRIEF SUMMARY OF THE INVENTION

Exemplary embodiments of the invention provide a method of fabricating a pixel cell having a global shutter gate structure in which a first gated charge barrier is provided between a photosensor and a first charge storage region and a gated second charge barrier is provided between the first charge storage region and a floating diffusion region. A global shutter gate controls the first charge barrier while a transfer gate controls the second charge barrier.

In accordance with one modified exemplary embodiment of the invention, a capacitive structure is also formed over the pixel sensor cell in order to provide overall increased charge storage capacity.

BRIEF DESCRIPTION OF THE DRAWINGS

The foregoing and other advantages and features of the invention will become more apparent from the detailed description of exemplary embodiments provided below with reference to the accompanying drawings in which:

FIG. 1B is a cross sectional view of the conventional pixel sensor cell of claim 1A taken along line A–A';

FIG. 2A is a top-down view of an exemplary pixel sensor cell constructed in accordance with the present invention;

FIG. 15 shows a processor system incorporating at least one imager device constructed in accordance with an embodiment of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion.

Figure 1A:
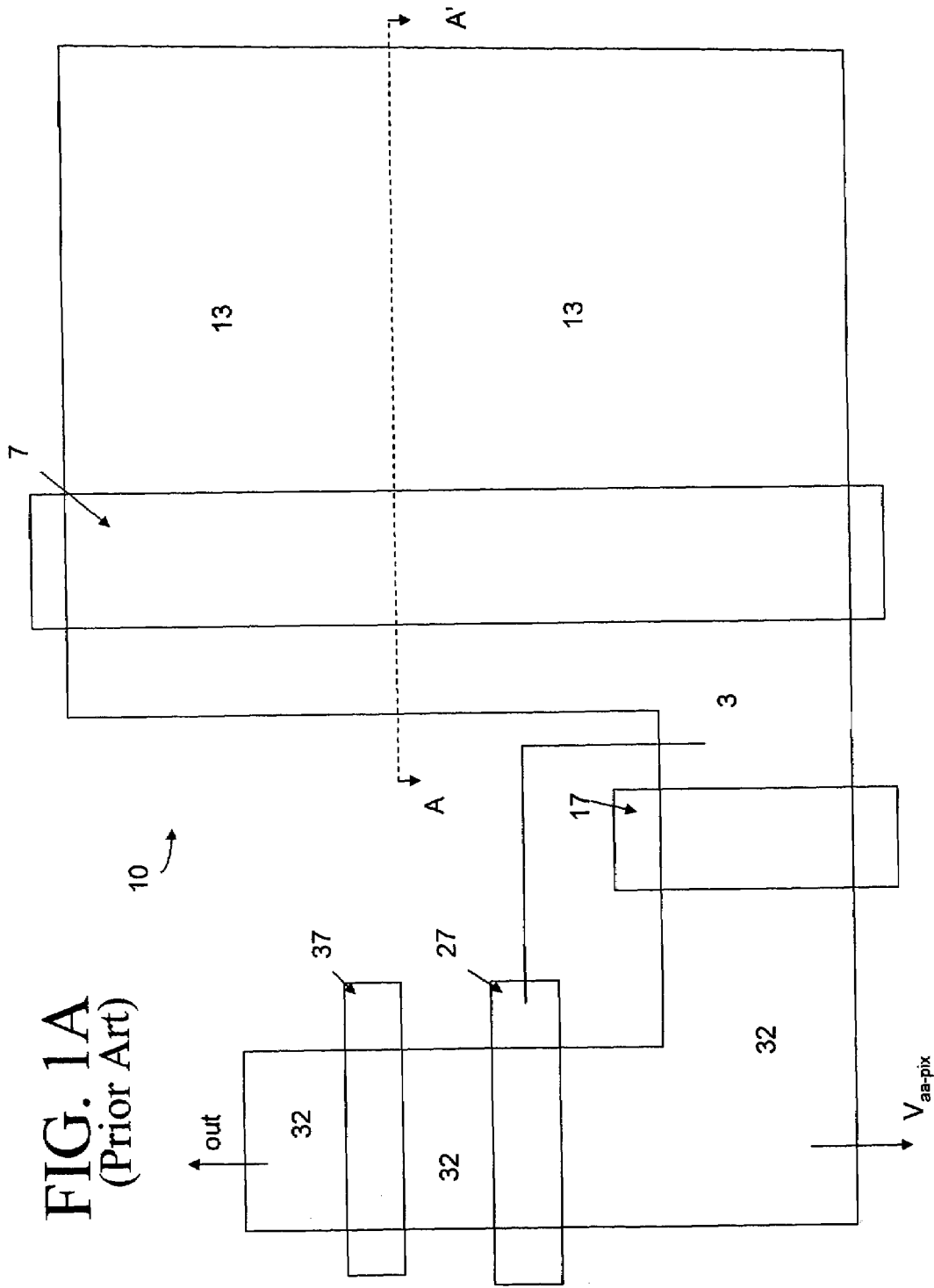
FIG. 1A is a top-down view of a conventional pixel sensor cell.
Figure 2B:
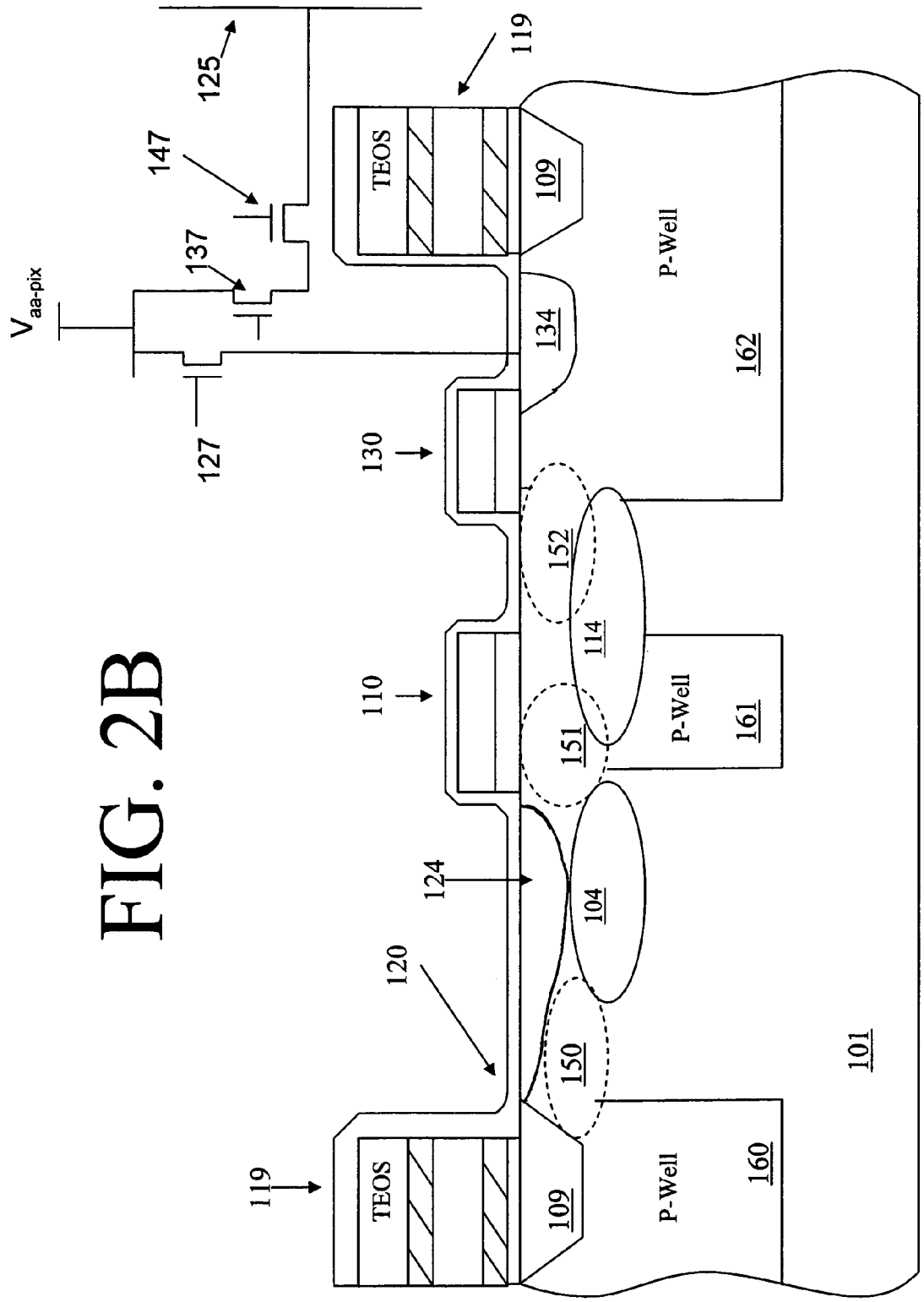
FIG. 2B is a cross-sectional view of the exemplary pixel sensor cell of FIG. 2A, taken along line B–B'.
Figure 14:
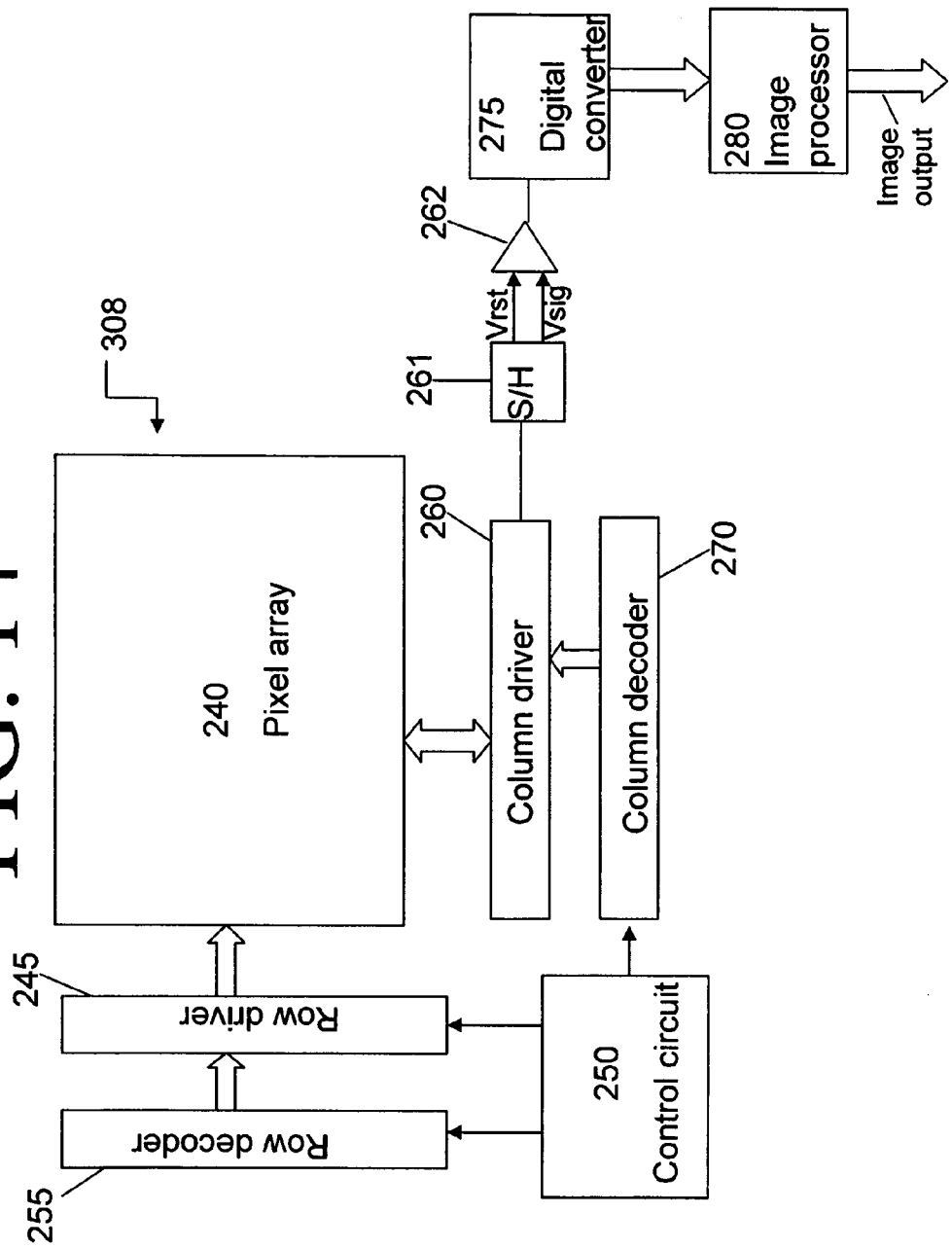
FIG. 14 depicts a block diagram of an imaging device including an exemplary pixel sensor cell constructed in accordance with the invention.

Although the invention is described herein with reference to the architecture and fabrication of one pixel cell, it should be understood that this is representative of a plurality of pixel cells in an array of an imager device such as array 240 of imager device 308 (FIG. 14). Now, referring to the drawings, where like numbers represent like elements, FIGS. 2A and 2B show a top-down and cross sectional view, respectively, of exemplary pixel cell 100. Pixel cell 100 has doped regions which create charge barriers both used to block and efficiently move charges from a photosensor, e.g. a photodiode 124, through a shutter transistor 110, to a storage area 114, and from there through a transfer transistor 130 to a floating diffusion region 134 which provides a pixel signal to the gate of a source follower transistor 137 for output.

Pixel cell 100 is formed in a p-type substrate 101. The pixel cell 100 has three large p-wells in the substrate 101, as shown in FIG. 2B. Two doped regions 104, 124 form a photodiode structure. The surface doped region 124 is illustratively doped p-type. The second doped region 104, located beneath the first doped region 124, is illustratively n-type. The second doped region is a charge accumulation region 104. These two doped regions 104, 124 create a p/n/p photodiode in the substrate 101. Located on either side of the accumulation region 104 are p-type doped regions 150, 151. Doped region 151 creates a controlled charge barrier between, for example, the accumulation region 104 and a first charge storage region 114 and mitigates leakage between these regions. Doped region 150 mitigates leakage at the isolation region 109 edge.

The charge storage region 114 is formed in the substrate 101 at least partially inside of a p-well 161. Located partially over the first charge storage region 114 is a charge storage gate 110. In operation, the charge storage gate 110 transfers charges from the accumulation region 104 of the photodiode to the charge storage region 114 by lowering a charge barrier between the two regions 104, 114. It should be understood that when pixel cell 100 is incorporated into a pixel array 240 (FIG. 14) each of the shutter storage gates 110 must be electrically connected together by conductive wiring in order to turn on and off each storage gate 110 at the same time in order to perform a global shutter.

Next, a transfer transistor gatestack 130 is formed adjacent to the charge storage gate 110. Like the charge storage gate 110, the transfer transistor gatestack 130 provides for the transfer of charges from the charge storage region 114 to a floating diffusion region 134. The floating diffusion region 134 is a lightly doped n-type region formed at least partially within a p-well 162 in the substrate 101. An additional p-type doped region 152 is located between the charge storage region 114 and the floating diffusion region 134. This p-type doped region 152 provides a controlled charge barrier for the flow of charges between these two regions 114, 134.

As shown schematically in FIG. 2B, the floating diffusion region 134 is electrically connected to the gate of the source follower transistor 137 for the readout operation. A reset transistor 127 is also connected to the floating diffusion region 134, and is used to reset the charge of the diffusion region 134. The pixel cell 100 also has a row select transistor 147, which connects the output of source follower transistor 137 to an associated column line 125 of a pixel array.

Pixel cell 100 also has shallow trench isolation regions 109 located on either side of the cell 100. Each isolation region 109 is located within a p-well. Formed above the isolation regions 109 are capacitor structures 119, which may be used to further increase the charge capacity of the cell 100. It should be understood that the capacitive structures 119 may also be formed at other locations on the pixel cell 100, including locations that are electrically connected to either of the charge storage region 114 or the floating diffusion region 134.

In operation of the pixel cell 100 as part of an imager device 308 (FIG. 14), the storage node 114 in the pixel cell 100 enables the floating diffusion region 134 to be reset and readout prior to charge transference of photo-generated charge originating at the photodiode accumulation region 104 to the floating diffusion region 134 after passing through storage region 114. This also allows for double sampling of the pixel cell 100 and a reduction of kTC noise. The total amount of charge the pixel 100 can store is increased since the gated storage node 114 has a greater charge storage capacity than the floating diffusion node 134.

Additionally, the charge transfer efficiency for pixel cell 100 is improved, as the storage gate 110 and transfer gate 130 effectively control the charge barriers between the charge accumulation region 104, charge storage area 114, and floating diffusion region 134 to ensure complete transfer of the charges generated in the photodiode accumulation region 104 which are then moved to the floating diffusion region 134. Specifically, when the storage gate 110 is turned on by control circuitry 250 (FIG. 14), the potential barrier between the charge storage regions 104, 114 is lowered, as the p-type region 151 is effectively inverted, thereby allowing accumulated electrons to flow from the accumulation region 104 to the charge storage region 114. Similarly, when the transfer gate 130 is turned on, the potential barrier between the charge storage regions 114, 134 is reduced, thereby allowing accumulated electrons to flow from the charge storage region 114 to the floating diffusion region 134.

With reference to FIGS. 3A–13, a method of fabricating the pixel cell 100 in accordance with a first exemplary embodiment is now described. During an initial stage of fabrication (FIG. 3A), isolation regions 109 are formed in a semiconductor substrate 101. Shallow trench isolation is one technique that may be used to form isolation regions 109 although other techniques as known in the art may also be used. A sacrificial oxide layer 102 is formed at the top surface of the substrate 101. The oxide layer 102 helps protect the substrate surface from damage and impurities during the following processing. The sacrificial oxide layer 102 may be formed by oxidizing the silicon substrate 101 surface, to form a layer of silicon dioxide 102, typically having a thickness in the range of about 50 to about 150 Angstroms thick.

Figure 4:
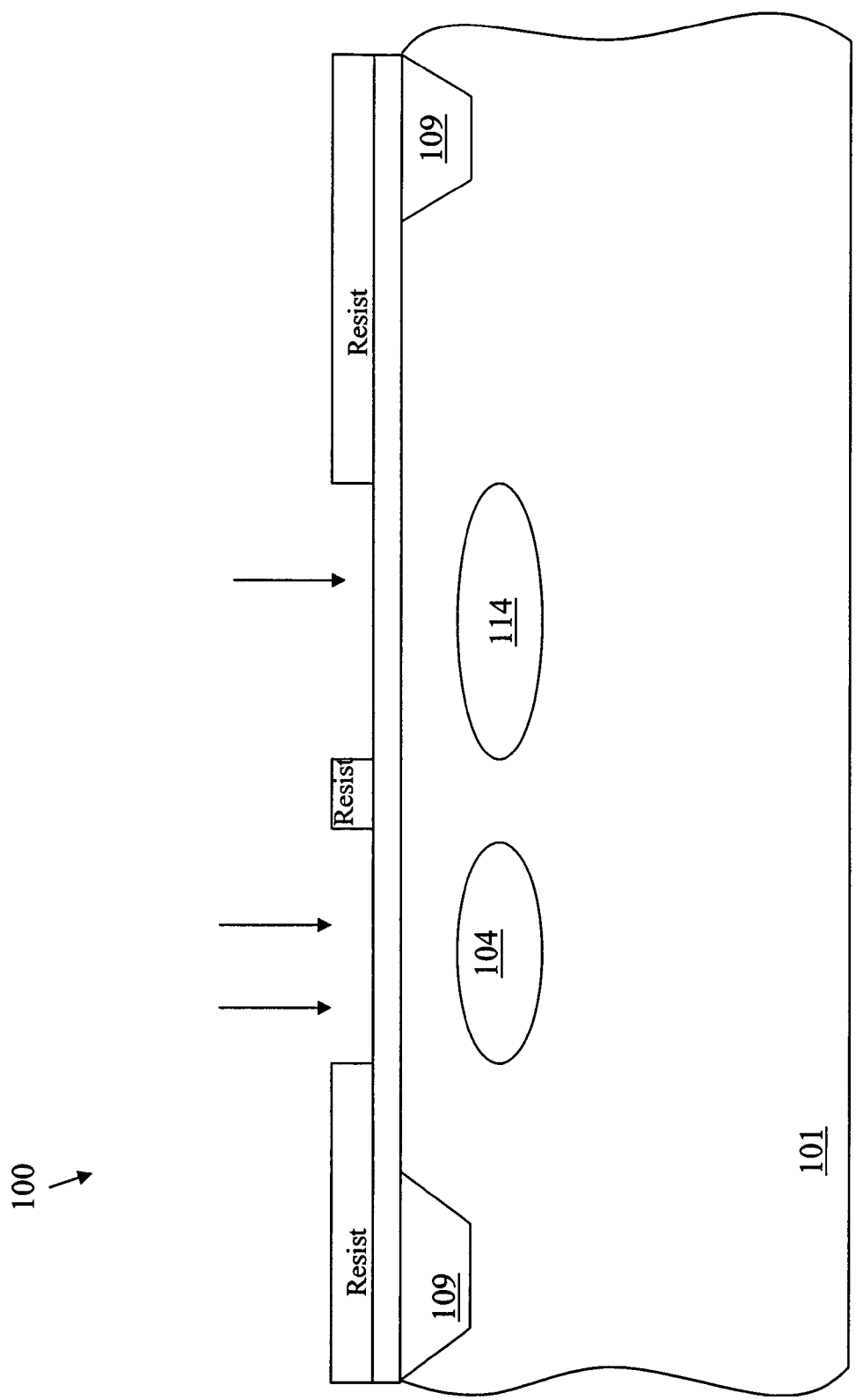
FIG. 4 is a cross-sectional view of the exemplary pixel sensor cell of FIG. 2A taken a stage of fabrication subsequent to that shown in FIGS. 3A and 3B.

Next, as shown in FIG. 4, a layer of photoresist is formed over the sacrificial oxide layer 102. The resist is patterned and developed as desired to form openings where dopants will be implanted into the substrate 101. Next, using any suitable n-type dopants, n-type doped regions 104 (charge accumulation region) and 114 (charge storage region) are formed. The n-type doped regions 104, 114 may have a dopant concentration within the range of about $1e^{16}$ to about $1e^{18}$ atoms per $cm^3$, preferably within the range of about $5e^{16}$ to $5e^{17}$ atoms per $cm^3$. The resist and sacrificial oxide layers are then stripped from the substrate 101 surface. Subsequently, a gate oxide layer 103 (FIG. 5) is formed over the substrate 101. The gate oxide layer 103 may be formed of any suitable gate dielectric material.

Figure 3A:
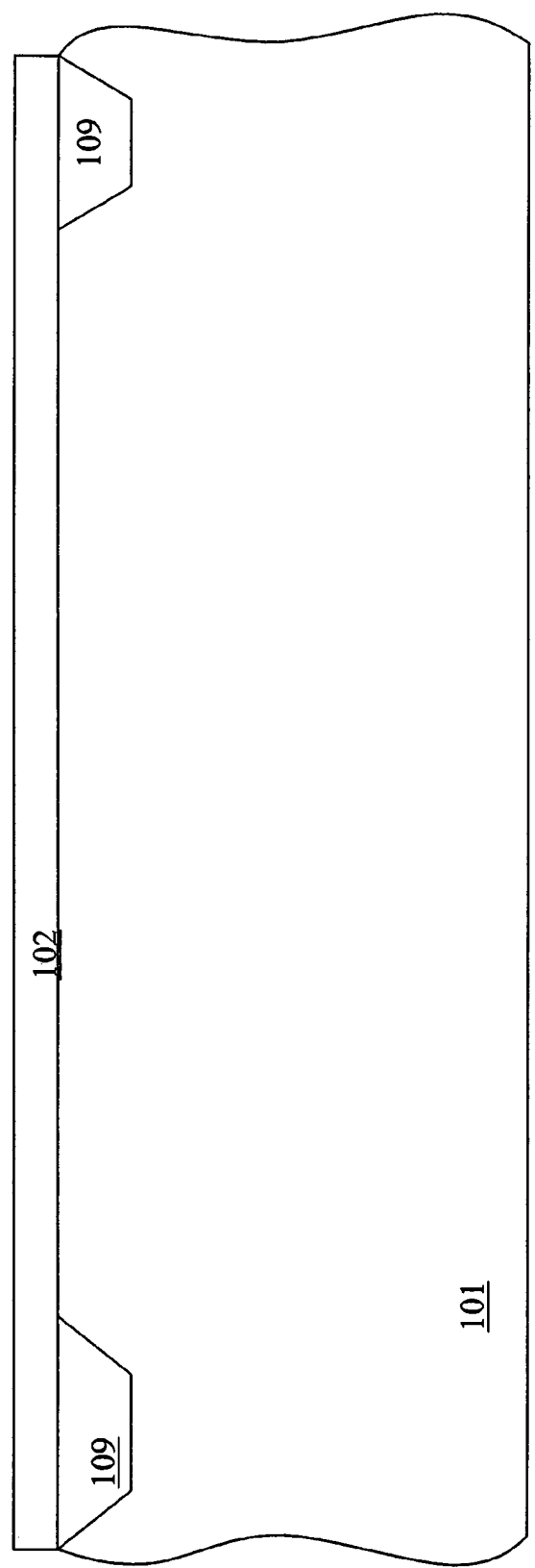
FIG. 3A is a cross-sectional view of the exemplary pixel sensor cell of FIG. 2A taken at an initial stage of fabrication in accordance with a first exemplary embodiment.
Figure 3B:
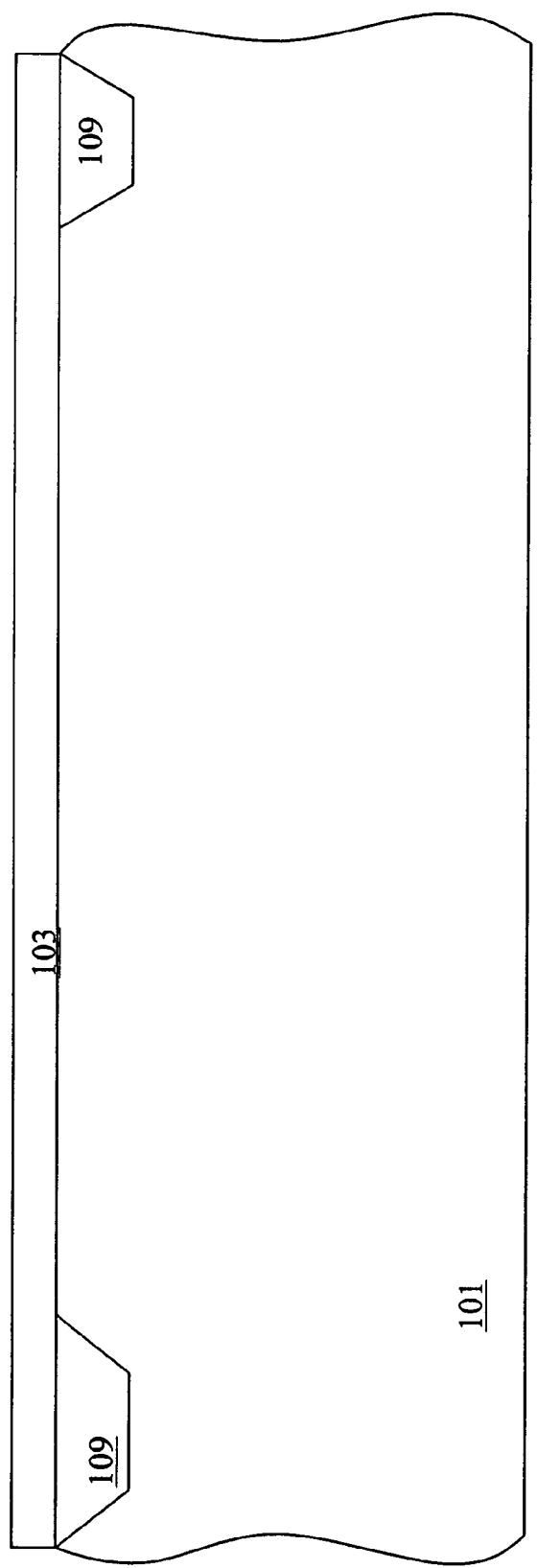
FIG. 3B is a cross-sectional view of the exemplary pixel sensor cell of FIG. 2A taken at an initial stage of fabrication in accordance with a second exemplary embodiment.

As an alternative to these first two stages of fabrication, FIG. 3B illustrates an alternative method of fabricating the pixel cell 100 in accordance with a second exemplary embodiment of the invention. Specifically, with reference to FIG. 3B, a sacrificial oxide layer 102 is formed by oxidizing a top surface of the substrate 101, but the sacrificial oxide layer 102 is immediately removed after formation. In its place, a gate oxide layer 103 is formed at the surface of the substrate 101. The gate oxide layer 103 may be formed of any suitable gate oxide material, including but not limited to silicon dioxide. After completion of this step, the remaining steps of fabrication are identical for each of the methods. Thus, it should be understood that the remaining figures illustrate the remaining steps for fabricating a pixel cell 100 having been initially fabricated in accordance with either exemplary method just described.

Figure 5:
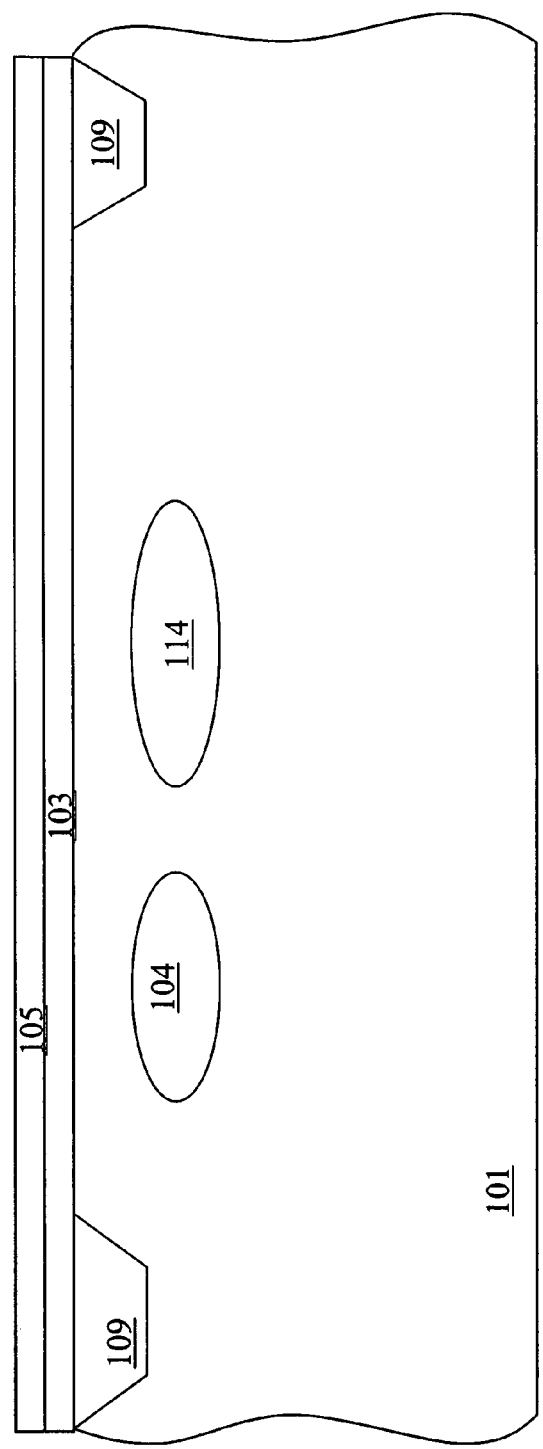
FIG. 5 is a cross-sectional view of the exemplary pixel sensor cell of FIG. 2A taken a stage of fabrication subsequent to that shown in FIG. 4.
Figure 6:
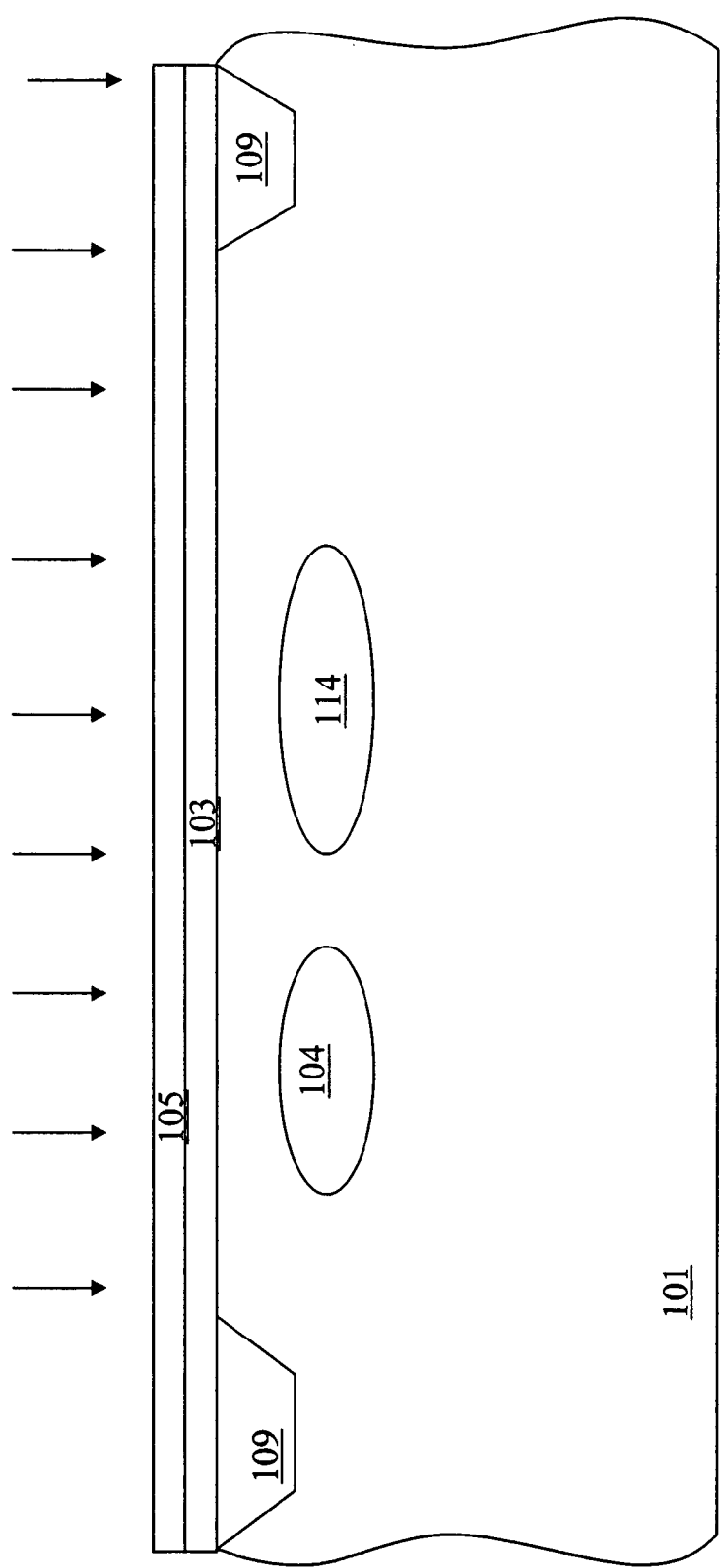
FIG. 6 is a cross-sectional view of the exemplary pixel sensor cell of FIG. 2A taken a stage of fabrication subsequent to that shown in FIG. 5.
Figure 7:
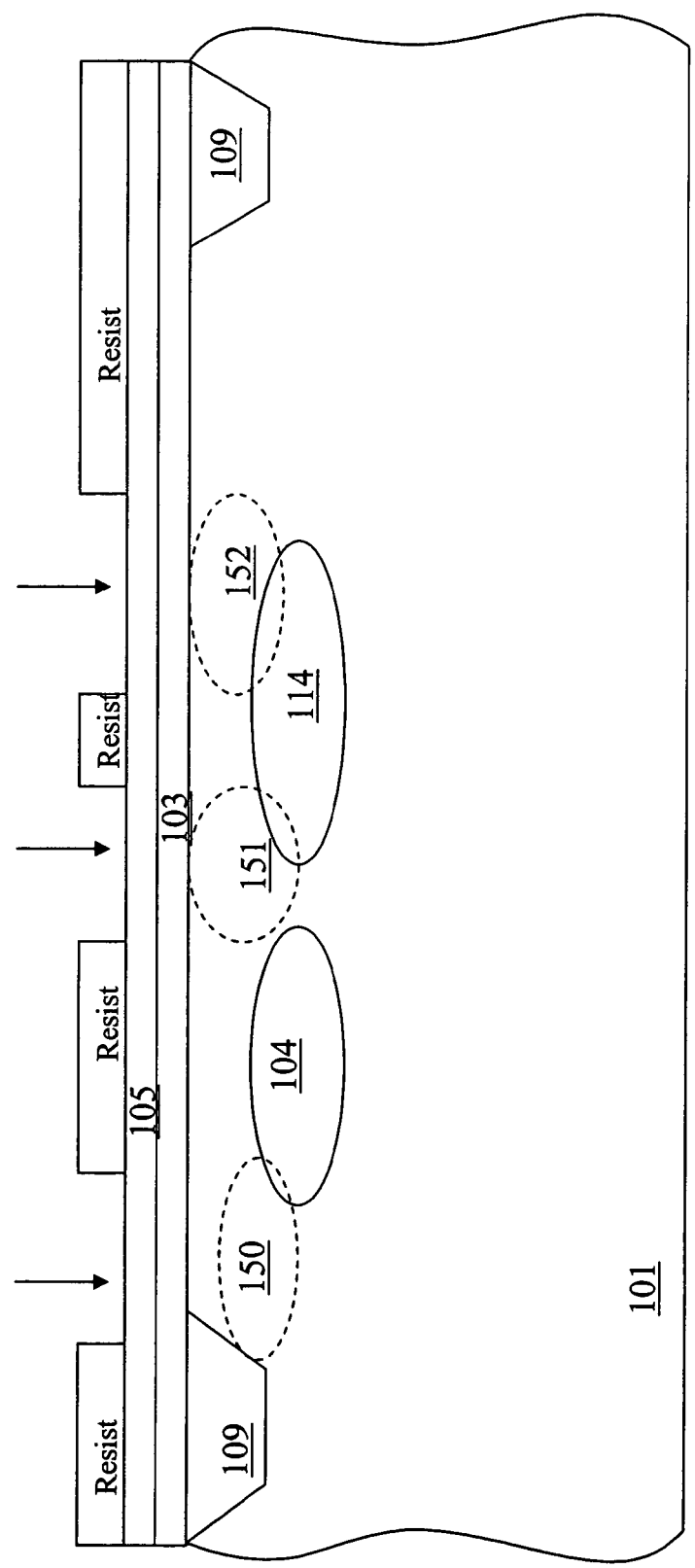
FIG. 7 is a cross-sectional view of the exemplary pixel sensor cell of FIG. 2A taken a stage of fabrication subsequent to that shown in FIG. 6.

Turning to FIG. 5, a layer of polysilicon 105 is deposited over the gate oxide layer 103. Next, as shown in FIG. 6, a blanket threshold voltage (Vt) adjustment implant deposits p-type dopants into the substrate 101. FIG. 7 illustrates a masked Vt adjustment implant which is accomplished by a layer of resist being deposited and patterned to form selective openings for the dopants. Any suitable p-type dopant may be utilized. This step is performed in order to adjust the threshold voltages of the subsequently formed transistors and to create a controlled charge barrier for the flow of electrons out of the accumulation region 104 and into the first storage region 114 and the floating diffusion region 134 (FIG. 2B). The p-type regions 150, 151, 152 formed are illustrated with dashed lines. These p-type regions 150, 151, 152 may have a p-type dopant concentration within the range of about $1e^{16}$ to about $1e^{18}$ atoms per $cm^3$, preferably within the range of about $5e^{16}$ to $5e^{17}$ atoms per $cm^3$.

Figure 8:
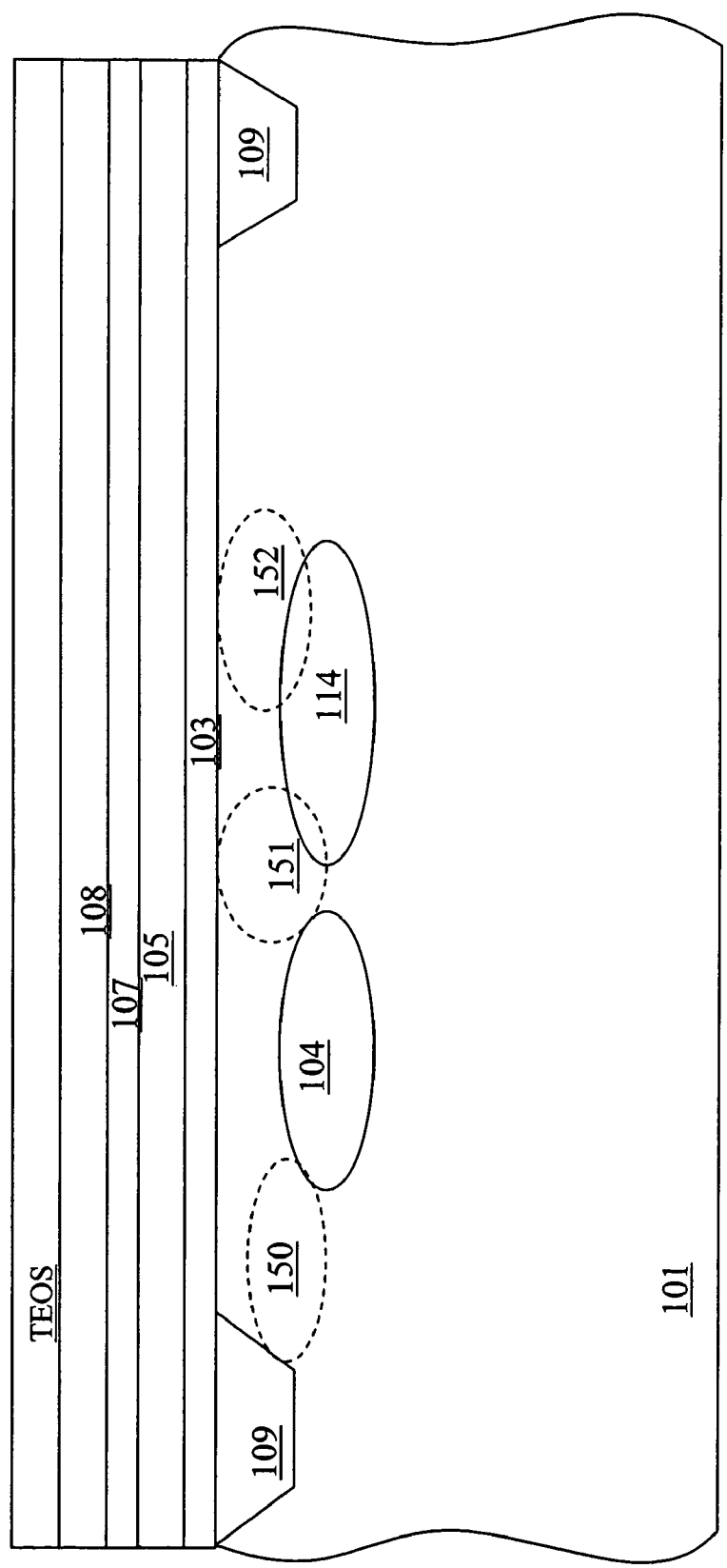
FIG. 8 is a cross-sectional view of the exemplary pixel sensor cell of FIG. 2A taken a stage of fabrication subsequent to that shown in FIG. 7.
Figure 9:
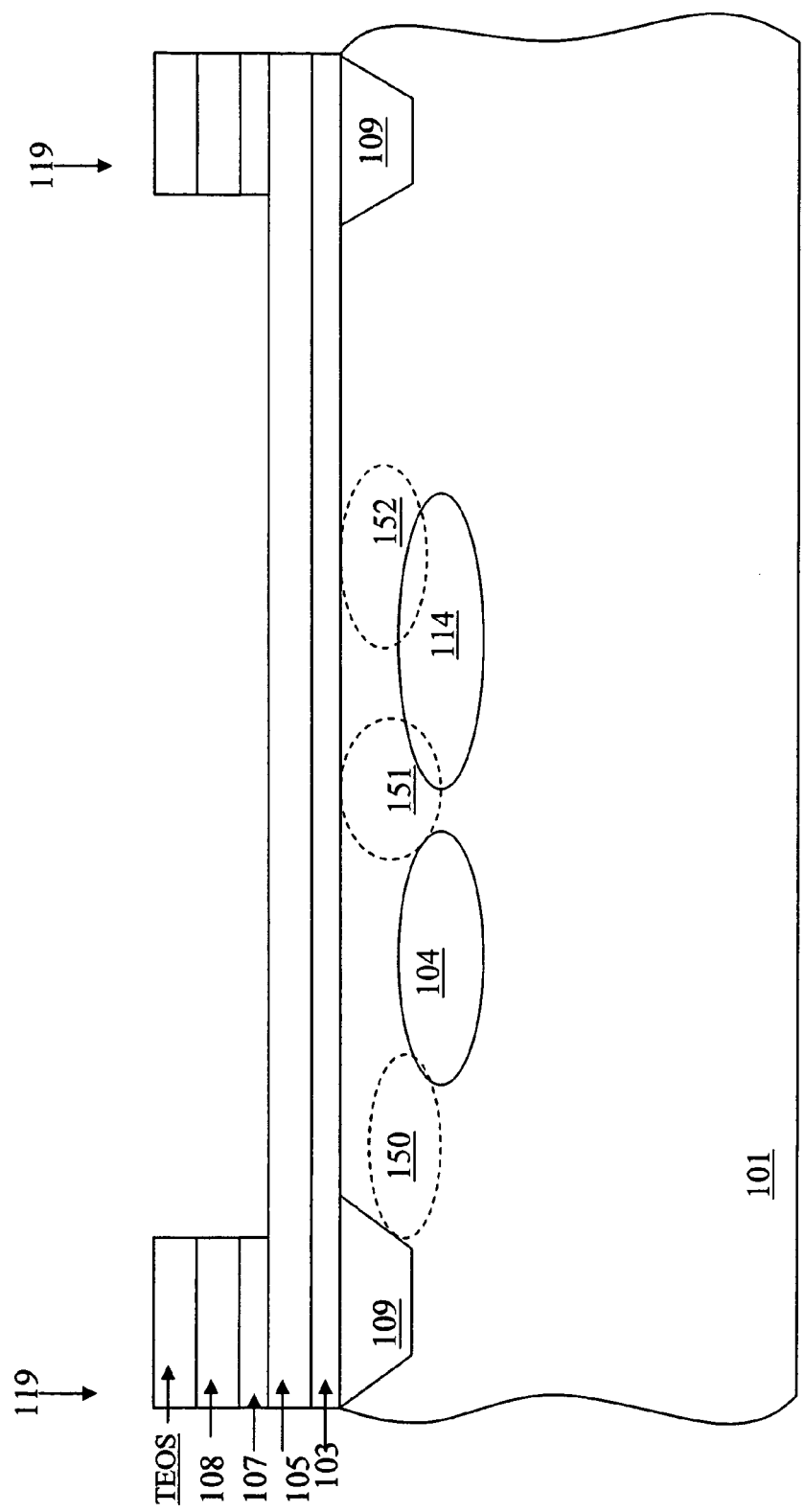
FIG. 9 is a cross-sectional view of the exemplary pixel sensor cell of FIG. 2A taken a stage of fabrication subsequent to that shown in FIG. 8.

Next, with reference to FIG. 8, several layers are deposited over the substrate. An insulating layer 107 is formed over the polysilicon layer 105. A second polysilicon layer 108 is then deposited over the insulating layer 107. A tetraethyl orthosilicate, (TEOS)-based oxide layer is formed over all of the layers 103, 105, 107, 108 to form a TEOS-based oxide cap. As shown in FIG. 9, an appropriate photoresist is utilized next and most of the insulating layer 107, second polysilicon layer 108 and TEOS cap layer are selectively removed. In the area above the isolation regions 109, each of the layers 103, 105, 107, 109, TEOS remains, thereby forming a capacitive structure 119. Over the rest of the pixel cell 100, only the gate oxide 103 and first polysilicon layers 105 remain.

Figure 10:
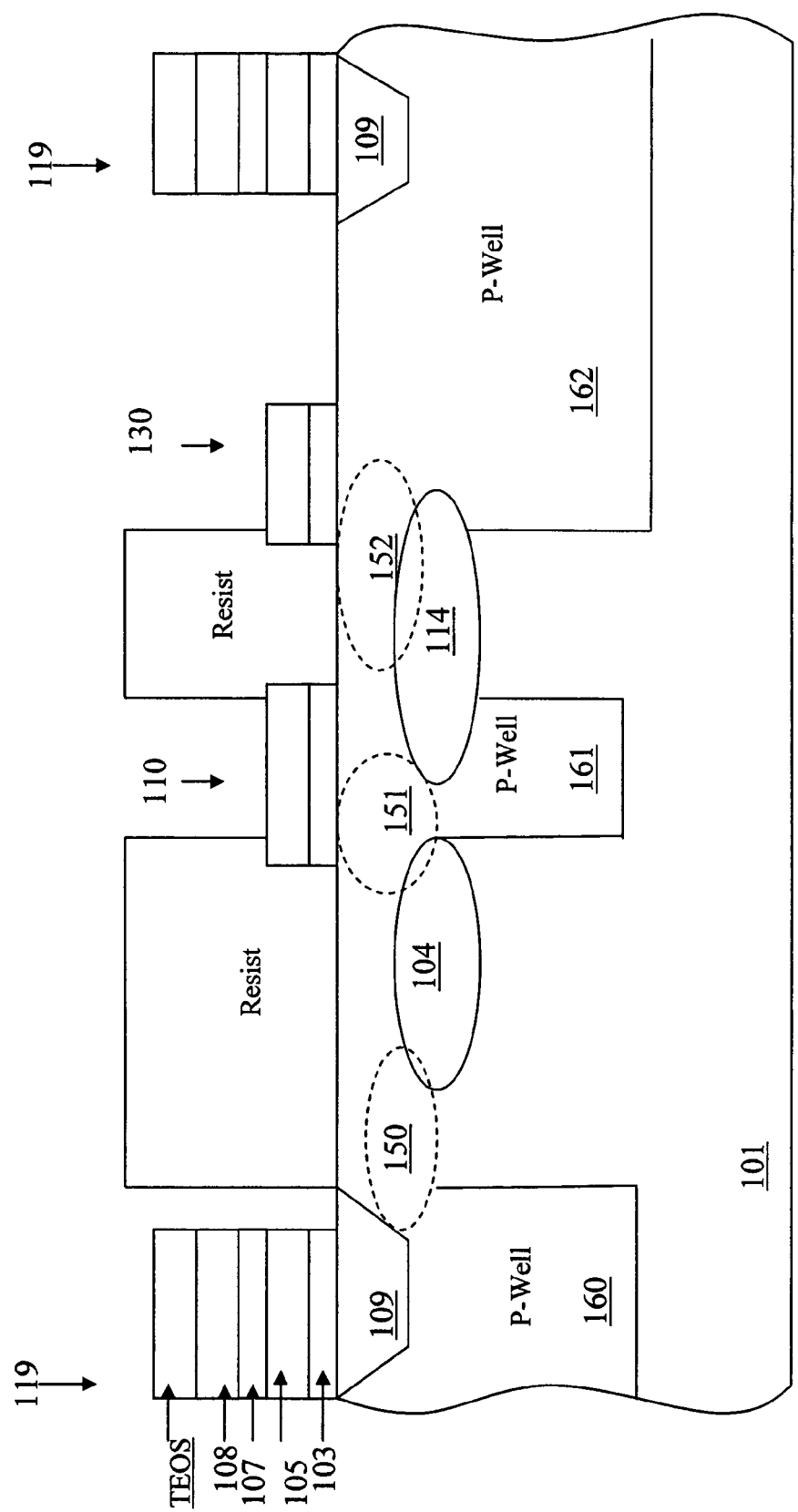
FIG. 10 is a cross-sectional view of the exemplary pixel sensor cell of FIG. 2A taken a stage of fabrication subsequent to that shown in FIG. 9.
Figure 11:
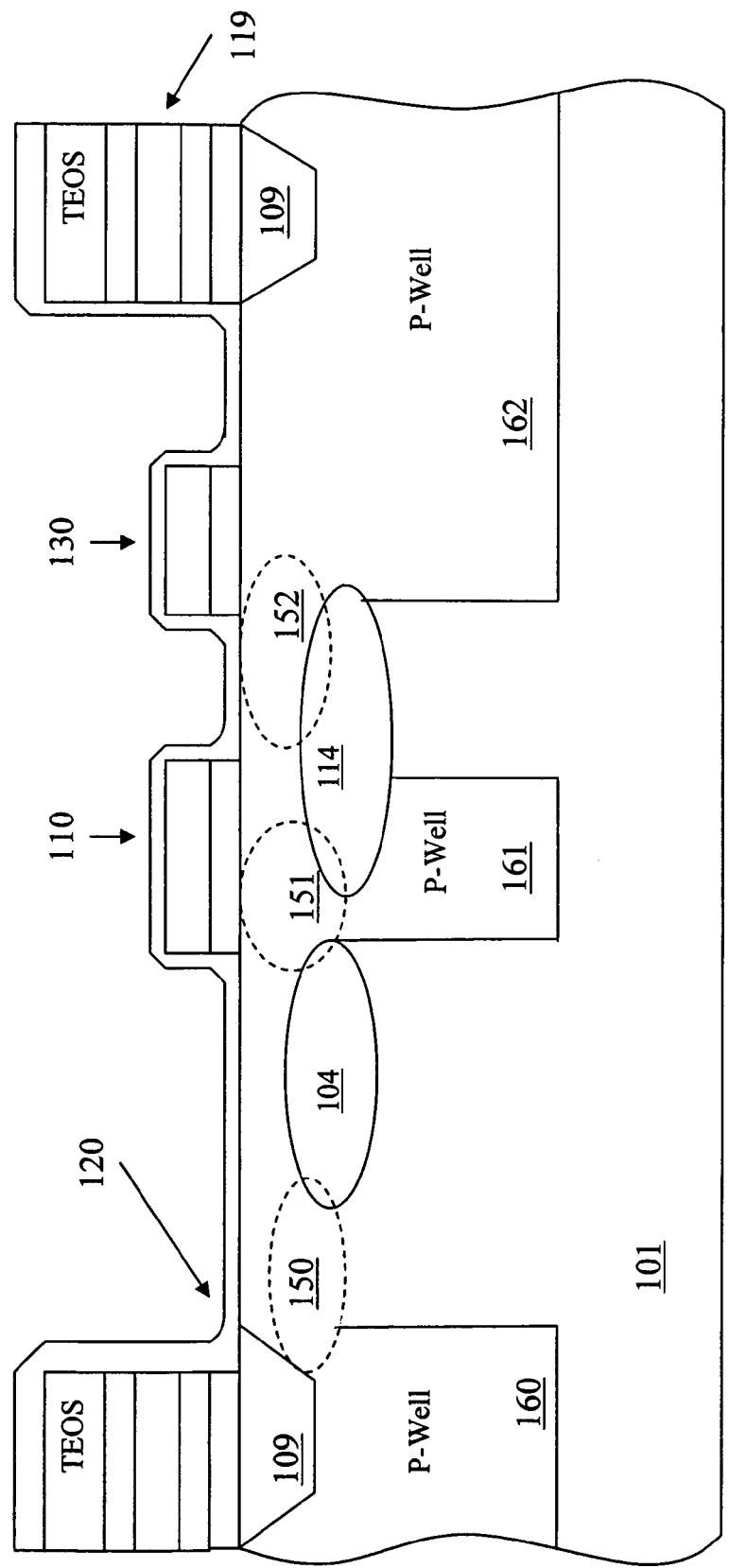
FIG. 11 is a cross-sectional view of the exemplary pixel sensor cell of FIG. 2A taken a stage of fabrication subsequent to that shown in FIG. 10.

Subsequently, the gate oxide 103 and polysilicon 105 layers are etched to form gatestacks as shown in FIG. 10. Next, another photoresist layer is deposited and patterned to form openings for dopant implantation. Suitable p-type dopants are then implanted into the substrate 101 to form p-wells 160, 161, 162. The p-wells may have a concentration of p-type dopants within the range of about $5e^{15}$ to about $1e^{18}$ atoms per $cm^3$, preferably within the range of about $1e^{16}$ to $1e^{17}$ atoms per $cm^3$. Next, the photoresist layer is stripped, and an oxide layer 120 (FIG. 11) is grown over the surface of the substrate 101. The oxide layer 120 forms an insulating cap and sidewalls on each of the capacitive structures 119 and surrounding the gatestacks 110, 130.

Figure 12:
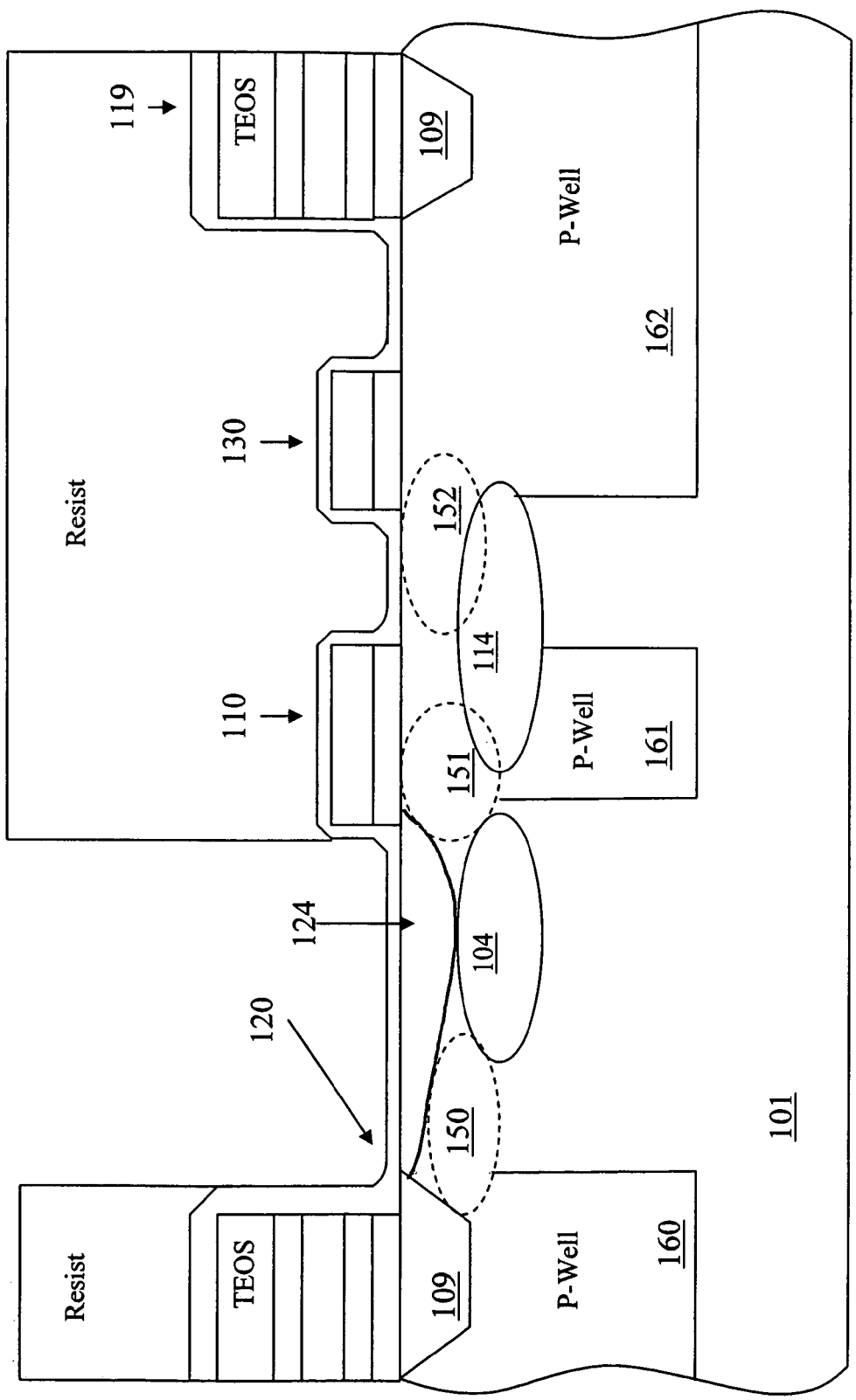
FIG. 12 is a cross-sectional view of the exemplary pixel sensor cell of FIG. 2A taken a stage of fabrication subsequent to that shown in FIG. 11.
Figure 13:
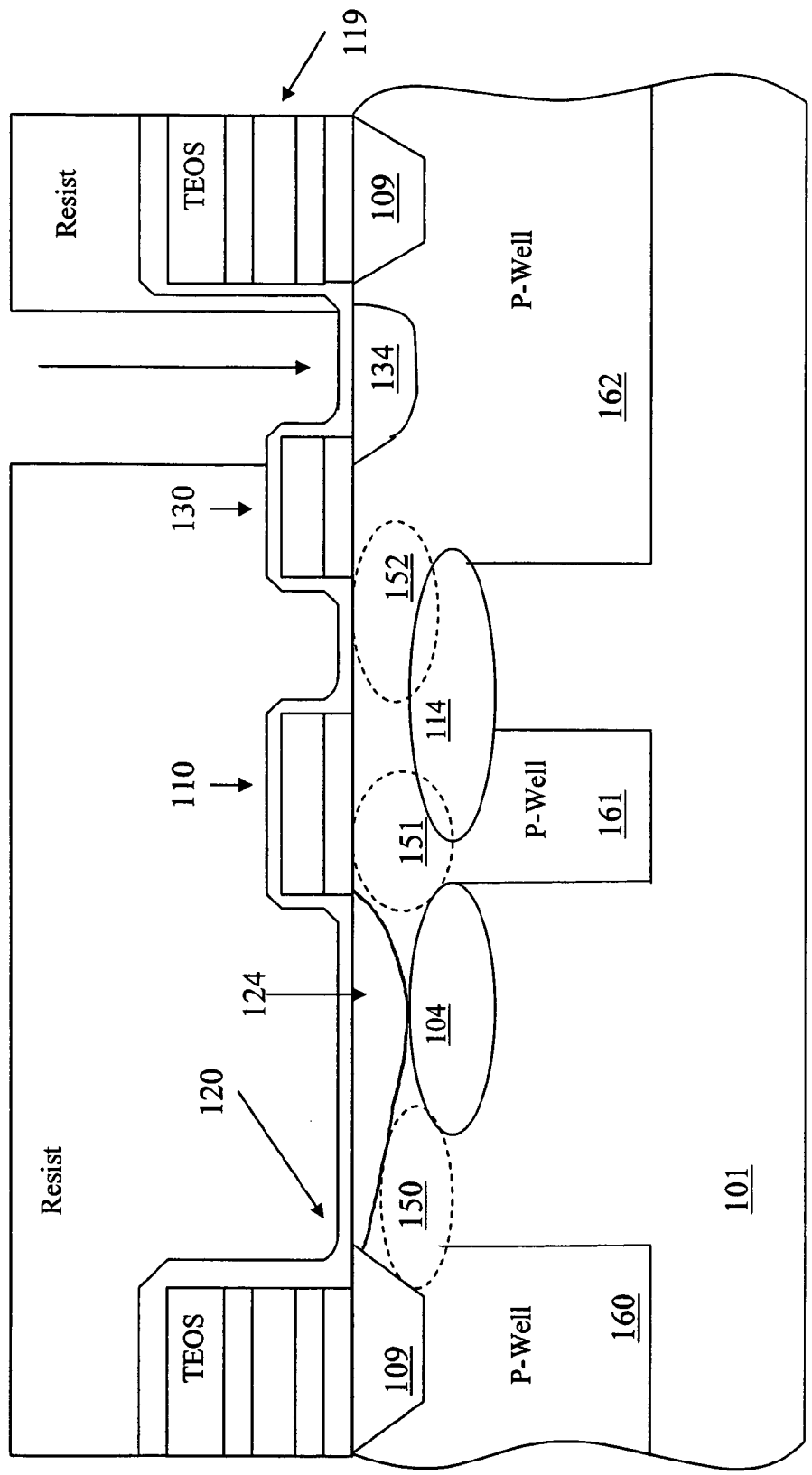
FIG. 13 is a cross-sectional view of the exemplary pixel sensor cell of FIG. 2A taken a stage of fabrication subsequent to that shown in FIG. 12.

As shown in FIG. 12, a photoresist layer is formed and patterned such that it is present everywhere except over the area of the doped region 104. In this area, p-type dopants are implanted into the substrate 101 to form a p-type surface region 124. The dopant concentration for surface region 124 may be within the range of about $2e^{17}$ to about $5e^{19}$ atoms per cm$^3$, and preferably within the range of about $5e^{17}$ to about $5e^{18}$ atoms per cm$^3$. The photoresist is then stripped, and another layer of photoresist is formed and patterned over the structures on the cell 100 as shown in FIG. 13. N-type dopants are implanted through a patterned opening in the resist, in order to create floating diffusion region 134 in the substrate 101. The floating diffusion region 134 has a concentration of n-type dopants within the range of about $1e^{17}$ to about $2e^{20}$ atoms per cm$^3$, preferably within the range of about $5e^{17}$ to $5e^{18}$ atoms per cm$^3$. The floating diffusion region 134 is located within a p-well 162.

At this stage, the formation of the exemplary pixel sensor cell 100 is essentially complete. Additional processing steps may be used to form insulating, photo device shielding, and interconnect metallization layers as desired.

FIG. 14 illustrates a block diagram of an exemplary CMOS imager 308 having a pixel array 240 comprising a plurality of pixels 100 arranged in a predetermined number of columns and rows, with each pixel cell being constructed as in one of the illustrated embodiments described above. Attached to the array 240 is signal processing circuitry, as described herein, at least part of which may be formed in the substrate. The pixels of each row in array 240 are all turned on at the same time by a row select line, and the pixels of each column are selectively output by respective column select lines. A plurality of row and column lines are provided for the entire array 240. The row lines are selectively activated by a row driver 245 in response to row address decoder 255. The column select lines are selectively activated by a column driver 260 in response to column address decoder 270. Thus, a row and column address is provided for each pixel.

The CMOS imager is operated by the timing and control circuit 250, which controls address decoders 255, 270 for selecting the appropriate row and column lines for pixel readout. The control circuit 250 also controls the row and column driver circuitry 245, 260 such that they apply driving voltages to the drive transistors of the selected row and column lines. The pixel column signals, which typically include a pixel reset signal ($V_{rst}$) and a pixel image signal ($V_{sig}$), are read by a sample and hold circuit 261. $V_{rst}$ is read from a pixel 100 immediately after the floating diffusion region 134 is reset by the reset gate 127. $V_{sig}$ represents the amount of charges generated by the photosensitive element of the pixel cell 100 in response to applied light. A differential signal ($V_{rst}-V_{sig}$) is produced by differential amplifier 262 for each pixel, which is digitized by analog-to-digital converter 275 (ADC). The analog to digital converter 275 supplies the digitized pixel signals to an image processor 280 which forms and outputs a digital image.

FIG. 15 illustrates a processor-based system 1100 including an imaging device 308, which has pixels constructed in accordance with the methods as described herein. For example, pixels may be the exemplary pixel cells 100 constructed in accordance with the exemplary embodiments of the invention described above. The processor-based system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 1100, for example a camera system, generally comprises a central processing unit (CPU) 1102, such as a microprocessor, that communicates with an input/output (I/O) device 1106 over a bus 1104. Imaging device 308 also communicates with the CPU 1102 over the bus 1104, and may include a CMOS pixel array having exemplary pixel cells 100, constructed as discussed above. The processor-based system 1100 also includes random access memory (RAM) 1110, and can include removable memory 1115, such as flash memory, which also communicates with CPU 1102 over the bus 1104. Imaging device 308 may be combined with a processor, such as a CPU, digital signal processor, or microprocessor, with or without memory storage on a single integrated circuit or on a different chip than the processor. Any of the memory storage devices in the processor-based system 1100 could store software for employing the above-described method.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming an image sensor pixel structure, said method comprising:
   forming a first and a second doped region of a first conductivity type in a substrate of a second conductivity type, said first and second doped regions corresponding to charge storage regions;
   forming a third and a fourth doped region in said substrate such that said first doped region is below said third doped region to form a photosensor and said fourth doped region is at least partially between said first and second doped regions to form a charge barrier between said first and second doped regions;
   forming a gate structure over at least a portion of said second and said fourth region such that said gate structure is operative to lower said charge barrier and gate charges from said first doped region to said second doped region.

2. The method of claim 1, further comprising the acts of:
   forming a fifth doped region of said first conductivity type laterally displaced from said second doped region; and
   forming a gate structure for gating charges from said second doped region to said fifth doped region.

3. The method of claim 1, further comprising forming a well of said second conductivity type in which said fifth doped region is located.

4. The method of claim 3, further comprising the act of forming a sixth doped region of said second conductivity type in said substrate and located between said second and fifth doped regions.

5. The method of claim 1, wherein said fourth doped region is formed within a doped well of said second conductivity type.

6. The method of claim 1, wherein said third doped region is at least partially coupled to said substrate.

7. The method of claim 1, wherein said third doped region is formed by forming a seventh doped region of said second conductivity type and an eighth doped region of said second conductivity type.

8. The method of claim 1, wherein said fourth doped region is formed by forming a ninth doped region of said second conductivity type and a tenth doped region of said second conductivity type, said tenth doped region forming a well of said second conductivity type at least a part of which is between said first and second doped regions.

9. A method of forming an imager pixel sensor cell, said method comprising the acts of:
    forming a photosensitive element in a substrate, said photosensitive element comprising a charge accumulation region;
    forming a first charge storage region for receiving charges from the charge accumulation region;
    forming a first controllable charge barrier between said charge accumulation region and the charge storage region;
    forming a first gate structure at least partially above said first charge storage region and controllable charge barrier, said first gate structure being operable to transfer charges from said charge accumulation region to said first charge storage region by lowering said first charge barrier;
    forming a second charge storage region for receiving charges from a first charge storage region;
    forming a second controllable charge barrier between said first charge storage region and said second charge storage region;
    forming a second gate structure operable to transfer charges from said first charge storage region to said second charge storage region by lowering said second charge barrier; and
    forming a capacitive structure for providing extra charge storage capacity for said pixel cell.

10. The method of claim 9, wherein the step of forming a photosensitive element comprises forming a p/n/p photodiode.

11. The method of claim 9, wherein the step of forming a capacitive structure comprises forming a capacitor over an isolation region.

12. The method of claim 9, wherein the step of forming a capacitive structure comprises forming a capacitor electrically connected to at least one of said first and said second charge storage regions.

13. The method of claim 9, further comprising the step of forming doped wells in the substrate.

14. The method of claim 13, wherein said doped wells are p-wells.

15. The method of claim 14, wherein at least one of said first and said second charge storage regions are located at least partially within a p-well.

16. The method of claim 15, wherein said second storage region is located within a p-well.

17. The method of claim 14, wherein at least one p-well is located beneath said first gate structure.

18. The method of claim 9, wherein said second storage region comprises a floating diffusion region.

19. The method of claim 18, wherein the floating diffusion region is further electrically connected to a reset transistor for resetting the charge at said floating diffusion region.

20. The method of claim 9, wherein the steps of forming a first and second charge storage region comprise the act of implanting n-type dopants into predetermined areas of the substrate.

21. The method of claim 20, wherein the charge accumulation region and the first charge storage region are n-type doped regions with a dopant concentration within the range of about $1e^{16}$ atoms per $cm^3$ to about $1e^{18}$ atoms per $cm^3$.

22. A method of forming an image sensor cell, the method comprising the acts of:
    providing a p-type substrate having a first dopant concentration;
    forming an n-type photo-generated charge accumulation region in the substrate;
    forming a controlled barrier in the substrate to the flow of charges out of the accumulation region by:
        forming a first p-type well region having a second dopant concentration; and
        forming a first p-type channel region located at least partially within the first p-type well region and having a third dopant concentration.

23. The method of claim 22, further comprising the step of forming a transistor having a gate formed at least partially over the first p-type well region, wherein the transistor is capable of controlling the controlled barrier.

24. The method of claim 22, further comprising the step of forming a first charge storage region located adjacent the channel region.

25. The method of claim 24, further comprising the step of forming a second p-type channel region located adjacent the first charge storage region.

26. The method of claim 25, further comprising the step of forming a second charge storage region formed adjacent the second channel region.

27. The method of claim 26, wherein the acts of forming a first and second charge storage region comprises doping pre-determined areas of the substrate n-type.

28. The method of claim 26, further comprising the act of forming a transfer transistor having a gatestack capable of transferring charges from the first to the second charge storage regions.

29. The method of claim 26, wherein the second charge storage region is formed within a second p-type well region.

30. The method of claim 22, wherein the first concentration is within the range of about $5e^{17}$ to about $1e^{20}$ atoms per $cm^3$.

31. The method of claim 30, wherein the second concentration is within the range of about $5e^{15}$ to about $1e^{18}$ atoms per $cm^3$.

32. The method of claim 31, wherein the second concentration is within the range of about $1e^{16}$ to about $1e^{17}$ atoms per $cm^3$.

33. The method of claim 30, wherein the third concentration is within the range of about $5e^{16}$ to about $1e^{18}$ atoms per $cm^3$.

34. The method of claim 33, wherein the third concentration is within the range of about $1e^{16}$ to about $1e^{18}$ atoms per $cm^3$.

* * * * *